(12) United States Patent
Chen et al.

(10) Patent No.: US 12,426,706 B2
(45) Date of Patent: Sep. 30, 2025

(54) SLIDE RAIL ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 92 days.

(21) Appl. No.: 18/308,034

(22) Filed: Apr. 27, 2023

(65) Prior Publication Data

US 2024/0188716 A1   Jun. 13, 2024

(30) Foreign Application Priority Data

Dec. 13, 2022   (TW) .................................. 111148130

(51) Int. Cl.
| | |
|---|---|
| *A47B 88/49* | (2017.01) |
| *A47B 88/423* | (2017.01) |
| *A47B 88/473* | (2017.01) |
| *H05K 7/14* | (2006.01) |
| *A47B 88/493* | (2017.01) |

(52) U.S. Cl.
CPC ............ *A47B 88/49* (2017.01); *A47B 88/423* (2017.01); *A47B 88/473* (2017.01); *A47B 88/493* (2017.01); *A47B 2210/0016* (2013.01); *A47B 2210/0018* (2013.01); *H05K 7/1489* (2013.01)

(58) Field of Classification Search
CPC ..... A47B 88/49; A47B 88/493; A47B 88/423; A47B 2210/0016; A47B 2210/0018; A47B 88/473; A47B 88/50; A47B 2210/0059; A47B 2088/4235; H05K 7/1489

See application file for complete search history.

(56) References Cited

U.S. PATENT DOCUMENTS

| | | | |
|---|---|---|---|
| 7,571,968 B2 * | 8/2009 | Ji .......................... | A47B 88/493 312/334.44 |
| 8,282,176 B1 * | 10/2012 | Chen .................... | A47B 88/493 312/334.46 |
| 10,098,459 B2 | 10/2018 | Chen et al. | |
| 10,342,341 B2 | 7/2019 | Chen et al. | |
| 10,376,054 B1 | 8/2019 | Chen et al. | |

(Continued)

FOREIGN PATENT DOCUMENTS

| | | | |
|---|---|---|---|
| JP | 2019181148 A | | 10/2019 |
| TW | 1733625 B | * | 7/2021 |

*Primary Examiner* — Kimberley S Wright
(74) *Attorney, Agent, or Firm* — Best & Flanagan LLP

(57) ABSTRACT

A slide rail assembly includes a first rail, a second rail, a locking member, a driving member and an operating member. The second rail is movable relative to the first rail. The locking member is configured to lock the second rail relative to the first rail at a predetermined position. The driving member is movable relative to the second rail. When the operating member is moved from an initial position to a non-initial position, the operating member is configured to drive the driving member to move to further drive the locking member to move, in order to unlock the second rail relative to the first rail at the predetermined position.

16 Claims, 8 Drawing Sheets

(56) References Cited

U.S. PATENT DOCUMENTS

| | | | |
|---|---|---|---|
| 10,398,228 B2* | 9/2019 | Chen | A47B 88/473 |
| 11,540,630 B2* | 1/2023 | Chen | A47B 88/423 |
| 2004/0056572 A1* | 3/2004 | Chen | A47B 88/473 |
| | | | 312/333 |
| 2007/0241651 A1 | 10/2007 | Burgess, III et al. | |
| 2008/0111457 A1* | 5/2008 | Ji | A47B 88/493 |
| | | | 312/334.44 |
| 2011/0176755 A1* | 7/2011 | Chen | E05B 65/466 |
| | | | 384/21 |
| 2011/0291539 A1* | 12/2011 | Leal | A47B 88/493 |
| | | | 312/334.44 |
| 2012/0043872 A1* | 2/2012 | Enos | A47B 88/493 |
| | | | 312/332.1 |
| 2012/0169199 A1* | 7/2012 | Chen | A47B 88/57 |
| | | | 312/334.44 |
| 2013/0077900 A1* | 3/2013 | Lowe | A47B 88/493 |
| | | | 384/18 |
| 2016/0135325 A1* | 5/2016 | Chen | A47B 88/477 |
| | | | 312/334.1 |
| 2017/0156498 A1* | 6/2017 | Chen | A47B 96/067 |
| 2018/0295989 A1* | 10/2018 | Chen | F16C 29/12 |
| 2018/0295990 A1* | 10/2018 | Chen | A47B 88/49 |
| 2019/0059585 A1* | 2/2019 | Chen | A47B 88/43 |
| 2020/0107636 A1* | 4/2020 | Chen | H05K 7/183 |
| 2022/0160127 A1* | 5/2022 | Chen | A47B 88/423 |

* cited by examiner

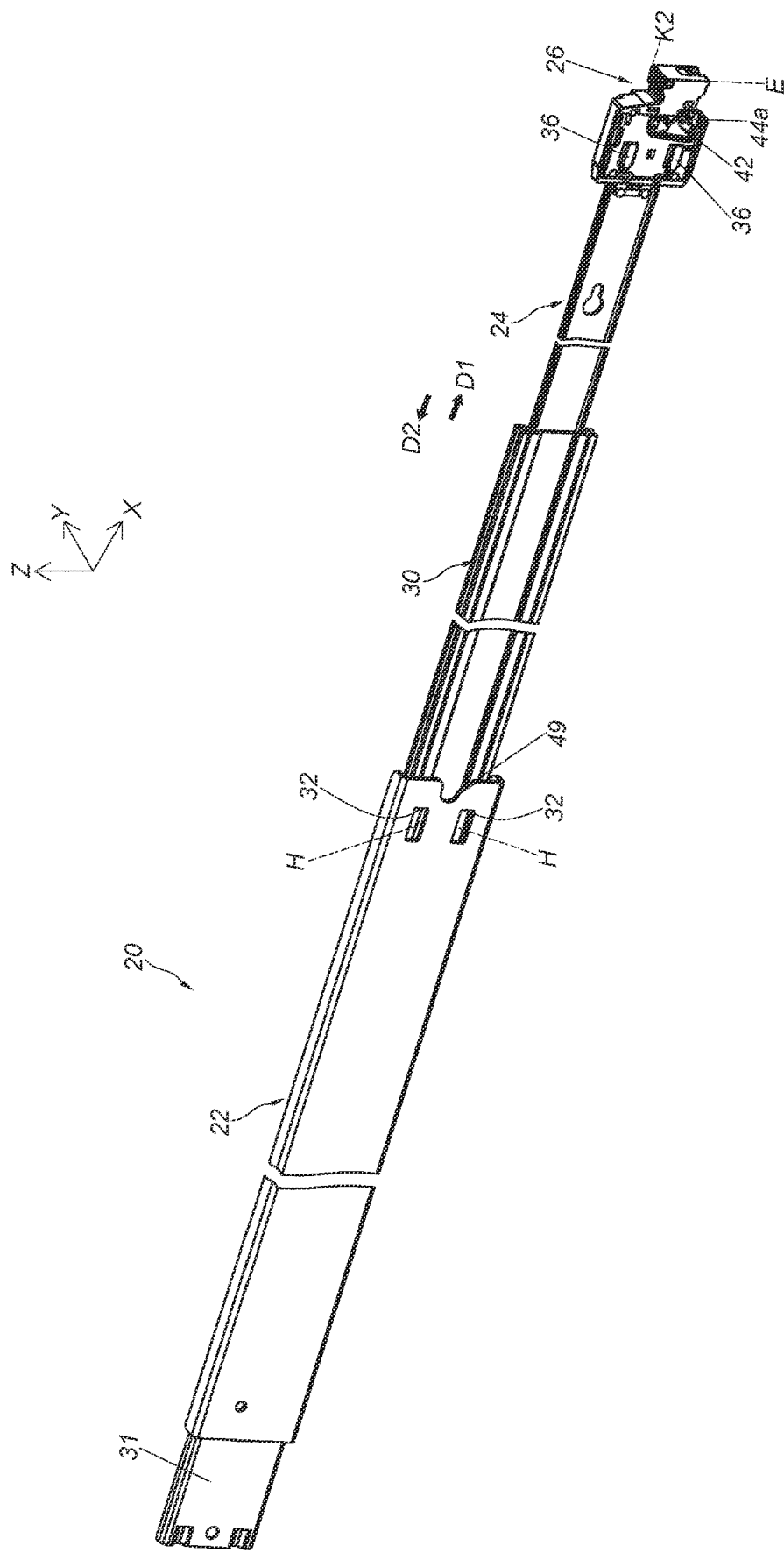

SLIDE RAIL ASSEMBLY

BACKGROUND OF THE INVENTION

1. Field of the Invention

The present invention relates to a slide rail assembly, and more particularly, to a slide rail assembly having a slide rail configured to be locked relative to another slide rail at a predetermined position.

2. Description of the Prior Art

U.S. Pat. No. 10,342,341 B2 discloses a slide rail assembly at least comprising a first rail and a second rail movable relative to each other. When the second rail is located at a retracted position relative to the first rail, a locking member is configured to abut against a blocking structure of the first rail in order to lock the second rail at the retracted position.

U.S. Pat. No. 10,098,459 B2 discloses a slide rail assembly at least comprising a first rail and a second rail movable relative to each other. When the second rail is located at a retracted position relative to the first rail, an engaging member is configured to be engaged with a stop on a bracket of the first rail in order to lock the second rail at the retracted position.

US patent publication number US 2022/0160127 A1 discloses a slide rail assembly comprising at least two rails. When one of the rails is located at a retracted position relative to the other rail, a locking member is configured to be engaged with a blocking portion of the first rail in order to lock the two rails at the retracted position.

The rails of the slide rail assemblies in the aforementioned cases are configured to be locked at the retracted positions through the locking member (or engaging member). The locking member (or engaging members) is configured to work by rotation. However, for different market requirements, it is important to develop various products for the user.

SUMMARY OF THE INVENTION

The present invention provides a slide rail assembly having a slide rail configured to be locked relative to another slide rail at a predetermined position.

According to an embodiment of the present invention, a slide rail assembly comprises a first rail, a second rail, a locking member, a driving member and an operating member. The second rail is movable relative to the first rail. The locking member is configured to lock the second rail relative to the first rail at a predetermined position. The driving member is movable relative to the second rail. When a force is applied to the operating member to move the operating member from an initial position to a non-initial position, the operating member is configured to drive the driving member to linearly move to further drive the locking member to move, in order to unlock the second rail relative to the first rail at the predetermined position.

Preferably, a linear moving direction of the driving member is substantially identical to a moving direction of the second rail relative to the first rail.

Preferably, the slide rail assembly further comprises a connecting member connected to the second rail. The connecting member is formed with a space configured to accommodate the operating member.

Preferably, when the operating member is located at the initial position, an operating part of the operating member is extended out of the space of the connecting member.

Preferably, when the operating member is located at the non-initial position, the operating part of the operating member is located inside the space of the connecting member.

Preferably, the space of the connecting member is further configured to accommodate the driving member and the locking member.

Preferably, a moving direction of the operating member is substantially perpendicular to the linear moving direction of the driving member.

Preferably, the slide rail assembly further comprises a first elastic member. When the second rail is locked relative to the first rail at the predetermined position, the operating member is configured to be held at the initial position in response to an elastic force of the first elastic member.

Preferably, the slide rail assembly further comprises a second elastic member, and the driving member is configured to be held at a first driving position in response to an elastic force of the second elastic member. When the force is applied to the operating member to move the operating member from the initial position to the non-initial position, the operating member is configured to drive the driving member to linearly move from the first driving position to a second driving position to further drive the locking member to switch from a locking state to an unlocking state, in order to unlock the second rail relative to the first rail at the predetermined position.

Preferably, the slide rail assembly further comprises a third elastic member configured to provide an elastic force to the locking member.

According to another embodiment of the present invention, a slide rail assembly comprises a first rail, a second rail, a connecting member, a locking member and an operating member. The second rail is longitudinally movable relative to the first rail. The connecting member is connected to the second rail. The locking member is configured to lock the second rail relative to the first rail at a retracted position. The connecting member is formed with a space configured to accommodate the operating member. When the operating member is moved from an initial position to a non-initial position, the operating member is configured to drive the locking member to transversely move to be switched from a locking state to an unlocking state, in order to unlock the second rail relative to the first rail at the retracted position.

Preferably, the slide rail assembly further comprises a driving member movable relative to the second rail. The operating member is configured to drive the locking member to transversely move to be switched from the locking state to the unlocking state through linear movement of the driving member.

Preferably, a linear moving direction of the driving member is substantially identical to a moving direction of the second rail relative to the first rail.

Preferably, moving directions of the operating member, the driving member and the locking member are substantially perpendicular to each other.

Preferably, when the operating member is located at the initial position, an operating part of the operating member is extended out of the space of the connecting member.

Preferably, when the operating member is located at the non-initial position, the operating part of the operating member is located inside the space of the connecting member.

Preferably, the space of the connecting member is further configured to accommodate the driving member and the locking member.

Preferably, the slide rail assembly further comprises a first elastic member, and the operating member is configured to be held at the initial position in response to an elastic force of the first elastic member.

Preferably, the slide rail assembly further comprises a second elastic member, and the driving member is configured to be held at a first driving position in response to an elastic force of the second elastic member. When a force is applied to the operating member to move the operating member from the initial position to the non-initial position, the operating member is configured to drive the driving member to linearly move from the first driving position to a second driving position to further drive the locking member to switch from the locking state to the unlocking state, in order to unlock the second rail relative to the first rail at the predetermined position.

Preferably, the slide rail assembly further comprises a third elastic member configured to provide an elastic force to the locking member.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 is a diagram showing the slide rail assembly being in an extended state according to an embodiment of the present invention.

DETAILED DESCRIPTION

Figure 1:
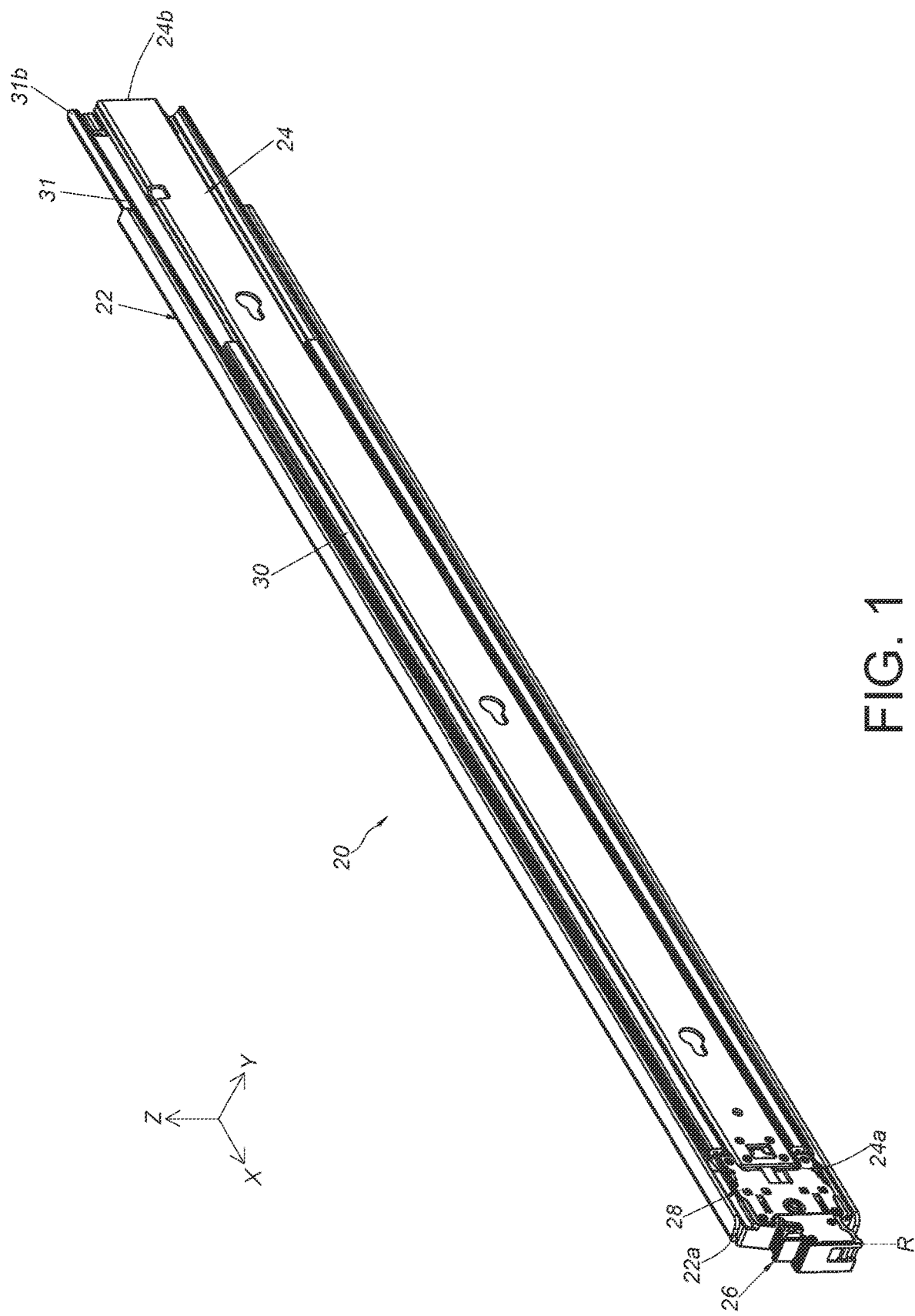
FIG. 1 is a diagram showing a slide rail assembly according to an embodiment of the present invention.
Figure 2:
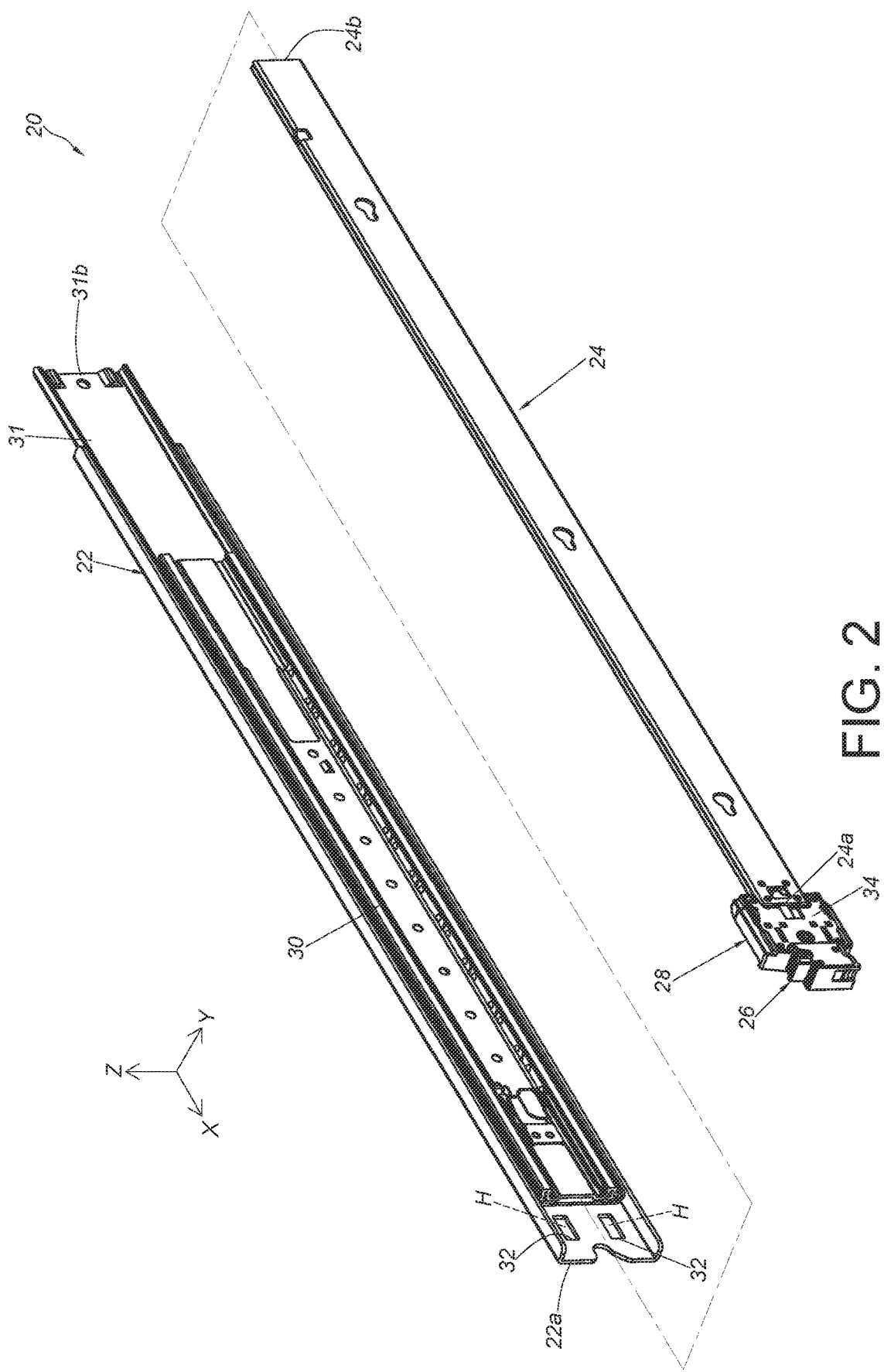
FIG. 2 is an exploded view of the slide rail assembly according to an embodiment of the present invention.

As shown in FIG. 1 and FIG. 2, a slide rail assembly 20 comprises a first rail 22, a second rail 24 and an operating member 26 according to an embodiment of the present invention. Preferably, the slide rail assembly 20 further comprises a connecting member 28.

The second rail 24 is longitudinally movable relative to the first rail 22 and is located at a predetermined position R (such as a retracted position, but the present invention is not limited thereto). In the present embodiment, the X-axis is a longitudinal direction (or a length direction of the slide rail), the Y-axis is a transverse direction (or a lateral direction of the slide rail), and the Z-axis is a vertical direction (or a height direction of the slide rail).

Preferably, the slide rail assembly 20 further comprises a third rail 30 and a fourth rail 31 movably mounted between the first rail 22 and the second rail 24. The third rail 30 and the fourth rail 31 are configured to extend a traveling distance of the second rail 24 relative to the first rail 22.

Preferably, the first rail 22 has a front part 22a. The fourth rail 31 has a rear part 31b. The first rail 22 comprises at least one blocking feature 32. In the present embodiment, the first rail 22 comprises two blocking features 32 as shown in FIG. 2, but one blocking feature 32 is enough to work normally. In addition, the blocking feature 32 is arranged adjacent to the front part 22a of the first rail 22. In the present embodiment, the blocking feature 32 is an inner wall of an opening H, but the present invention is not limited thereto. Or, in other embodiments, the blocking feature 32 can be an inner wall of a recessed part or a groove; or the blocking feature 32 can be a protrusion. The present invention is not limited thereto.

The connecting member 28 is connected, such as fixedly connected, to the second rail 24. The connecting member 28 can be seen as a portion of the second rail 24. The second rail 24 has a front part 24a and a rear part 24b. In the present embodiment, the connecting member 28 is arranged adjacent to the front part 24a of the second rail 24.

Figure 3:
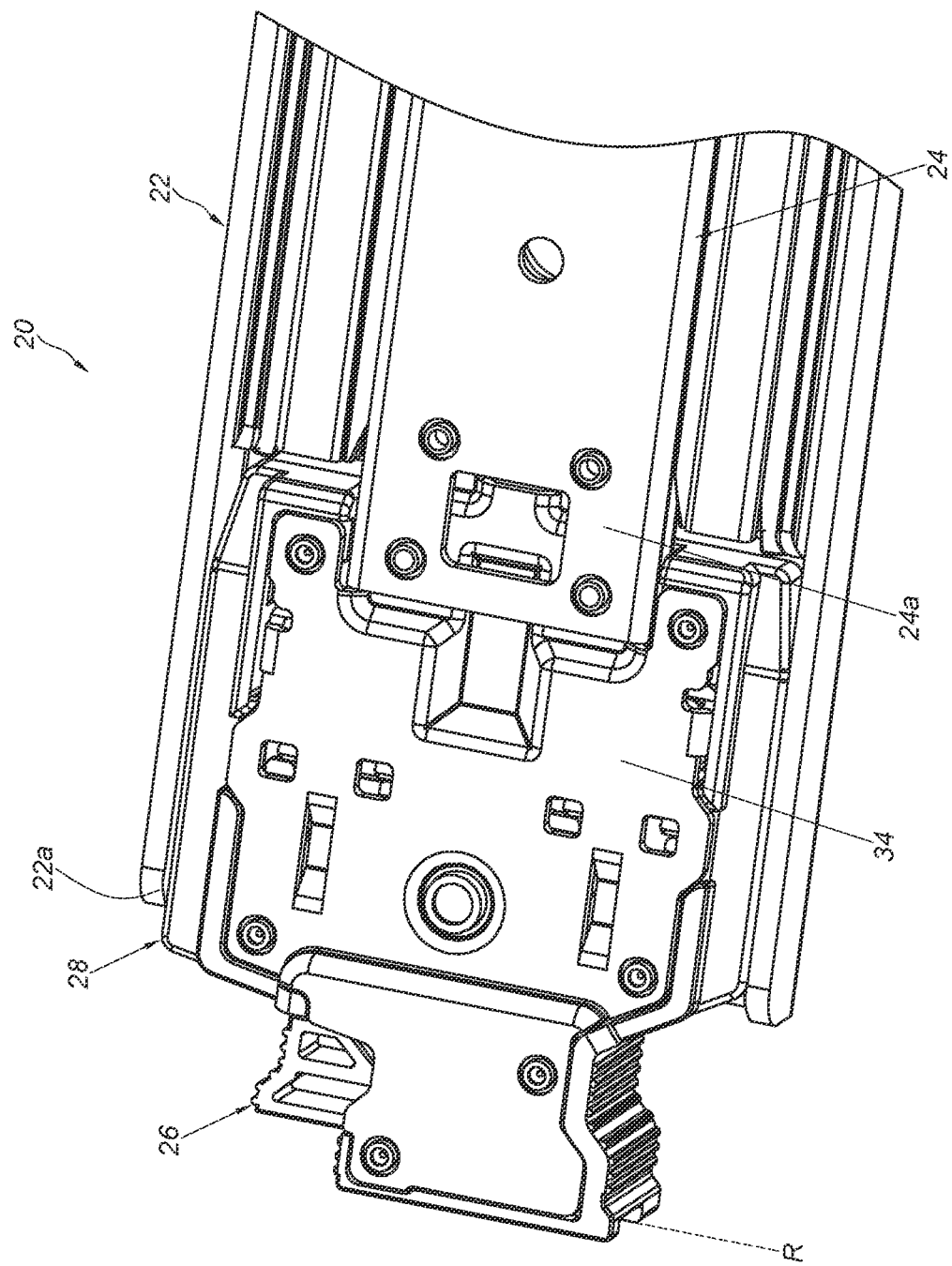
FIG. 3 is a partial view of the slide rail assembly comprising a cover body according to an embodiment of the present invention.
Figure 4:
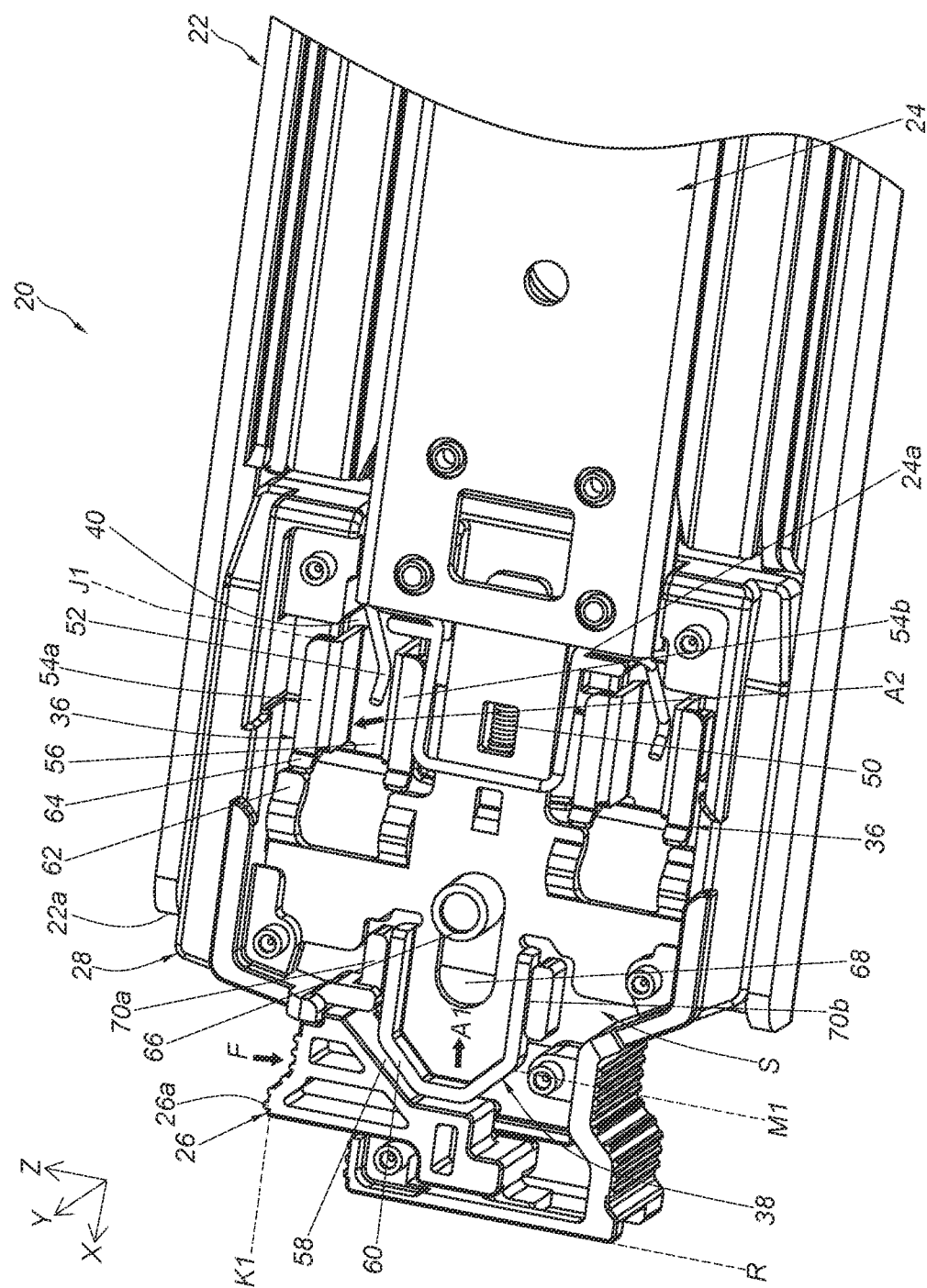
FIG. 4 is a partial view of the slide rail assembly with removing the cover body in a first viewing angle according to an embodiment of the present invention.

As shown in FIG. 3 and FIG. 4, the connecting member 28 comprises a cover body 34 (as shown in FIG. 3). After removing the cover body 34, it can be seen that the slide rail assembly 20 further comprises at least one locking member 36 and a driving member 38 (as shown in FIG. 4). In the present embodiment, the slide rail assembly 20 comprises two locking members 36 as shown in FIG. 4, but one locking member 36 is enough to work normally. The locking member 36 is configured to interact with the blocking feature 32.

Figure 5:
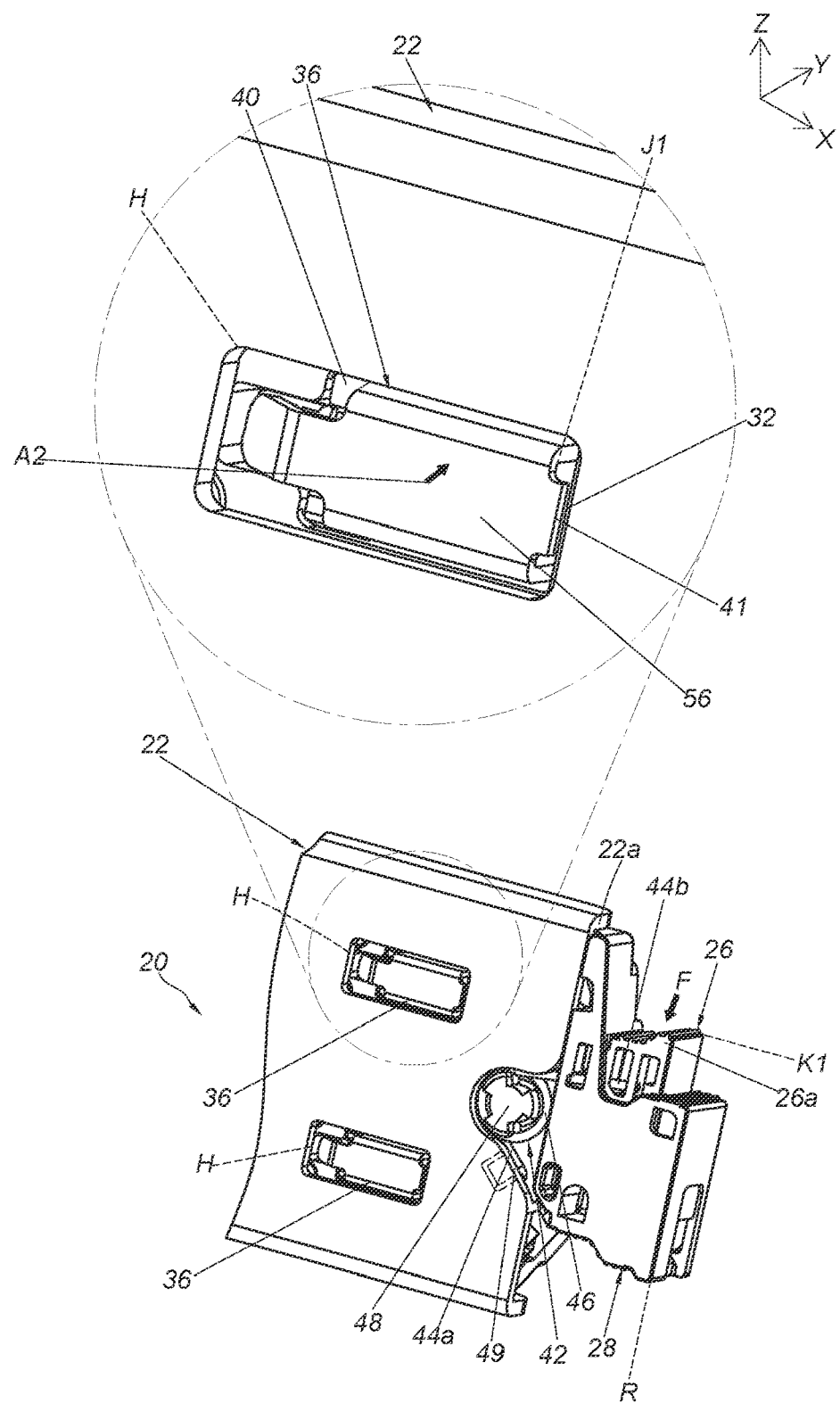
FIG. 5 is a partial view of the slide rail assembly in a second viewing angle according to an embodiment of the present invention.

As shown in FIG. 4 and FIG. 5, the connecting member 28 is formed with a space S configured to accommodate the operating member 26, the locking member 36 and the driving member 38.

Preferably, the connecting member 28 is formed with a through hole 40 corresponding to the locking member 36, and the through hole 40 is communicated with the space S. When the second rail 24 is located relative to the first rail 22 at the predetermined position R, the through hole 40 corresponds to the opening H of the first rail 22, and the locking member 36 can be extended into the opening H of the first rail 22 through the through hole 40 (as shown in FIG. 5). When the second rail 24 is located relative to the first rail 22 at the predetermined position R, the locking member 36 is configured to lock the second rail 24 relative to the first rail 22 at the predetermined position R. More particularly, a locking section 41 of the locking member 36 in a locking state J1 is configured to interact with the blocking feature 32 of the first rail 22 for locking the second rail 24 (as shown in FIG. 5). For example, the locking section 41 of the locking member 36 and the blocking feature 32 of the first rail 22 are configured to block each other in order to lock the second rail 24 relative to the first rail 22 at the predetermined position R.

Preferably, the slide rail assembly 20 further comprises a first elastic member 42 (as shown in FIG. 5), and the operating member 26 is configured to be held at an initial position K1 in response to an elastic force of the first elastic member 42. In the present embodiment, the first elastic member 42 is a torsion spring, but the present invention is not limited thereto. Furthermore, the first elastic member 42 comprises a first elastic part 44a, a second elastic part 44b and a mounting part 46 connected between the first elastic part 44a and the second elastic part 44b. The mounting part 46 is mounted to a corresponding feature 48 of the connecting member 28 (such as a protruded section, but the present invention is not limited thereto). The first elastic part 44a is configured to abut against a predetermined portion 49 of the first rail 22 (as shown in FIG. 5), and the second elastic part 44b is configured to provide an elastic force to the operating member 26 accordingly, such that the operating member 26 can be held at the initial position K1.

Preferably, the sliding rail assembly 20 further comprises a second elastic member 50 (as shown in FIG. 4), and the driving member 38 is configured to be held at a first driving position M1 in response to an elastic force of the second elastic member 50. In the present embodiment, the second elastic member 50 is a compression spring, but the present invention is not limited thereto.

Preferably, the slide rail assembly 20 further comprises a third elastic member 52 configured to provide an elastic force to the locking member 36 (as shown in FIG. 4), and the locking member 36 is configured to be held in the locking state J1 in response to the elastic force of the third elastic member 52 (as shown in FIG. 4 and FIG. 5). In the present embodiment, the third elastic member 52 is a wire form spring, which is made of a specific material (such as a metal material), but the present invention is not limited thereto.

Preferably, the locking member 36 comprises a first wing part 54a, a second wing part 54b and a main body part 56 connected between the first wing part 54a and the second wing part 54b (as shown in FIG. 4). The main body part 56 corresponds to the through hole 40 of the connecting member 28. The first wing part 54a and the second wing part 54b are bent at a predetermined angle relative to the main body part 56. When the locking member 36 is held in the locking state J1 by the elastic force of the third elastic member 52, the first wing part 54a and the second wing part 54b are configured to respectively abut against outer edge walls surrounding the through hole 40 (as shown in FIG. 4).

Preferably, the main body part 56 of the locking member 36 has a first side and a second side opposite to each other. The third elastic member 52 is configured to apply an elastic force to the first side of the main body part 56 of the locking member 36 (as shown in FIG. 4). When the second rail 24 is located relative to the first rail 22 at the predetermined position R, the second side of the main body part 56 of the locking member 36 corresponds to the opening H of the first rail 22 (as shown in FIG. 5). In addition, the main body part 56 of the locking member 36 has the locking section 41 (as shown in FIG. 5).

Figure 6:
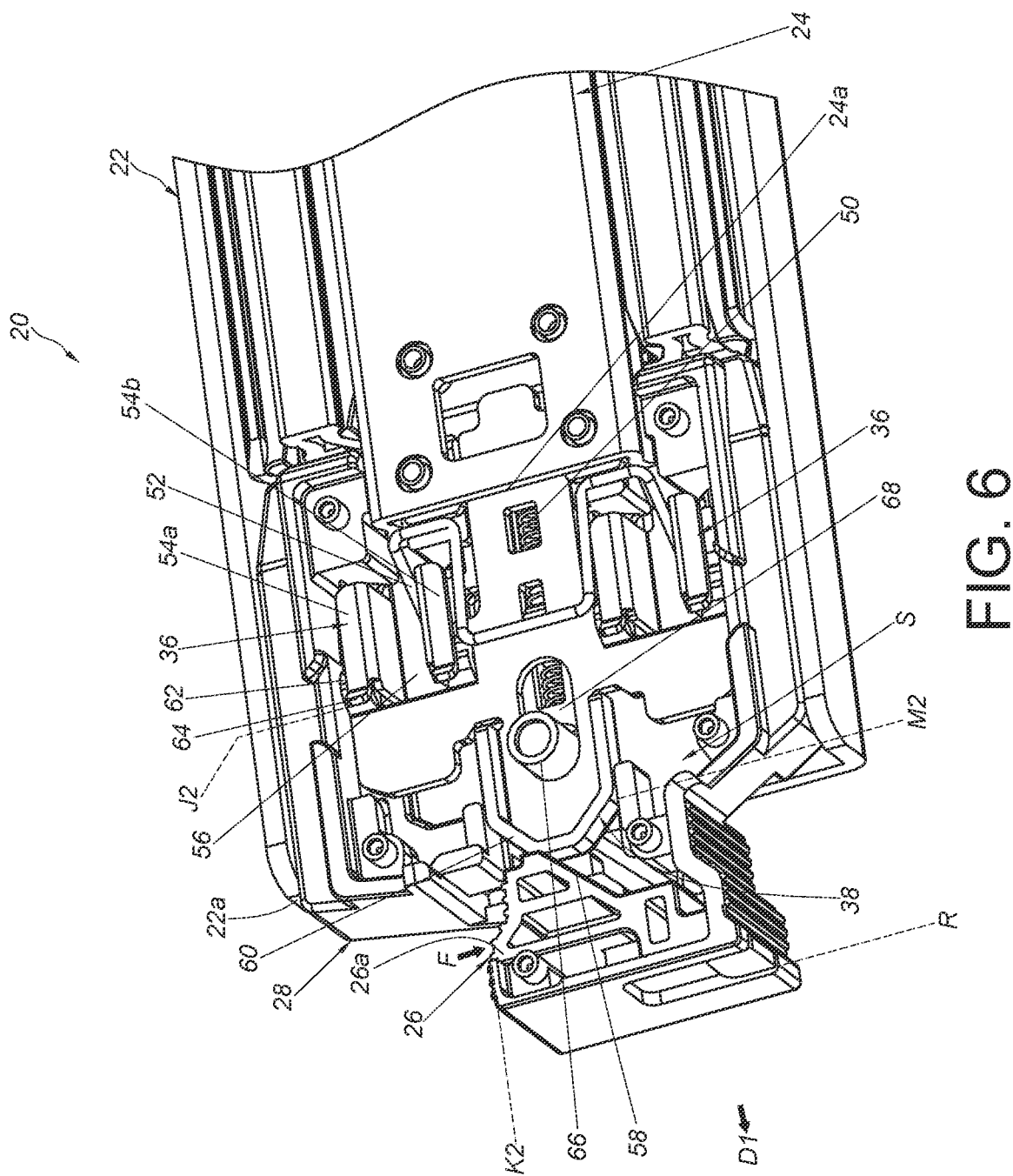
FIG. 6 is a partial view of the slide rail assembly with removing the cover body according to an embodiment of the present invention.
Figure 7:
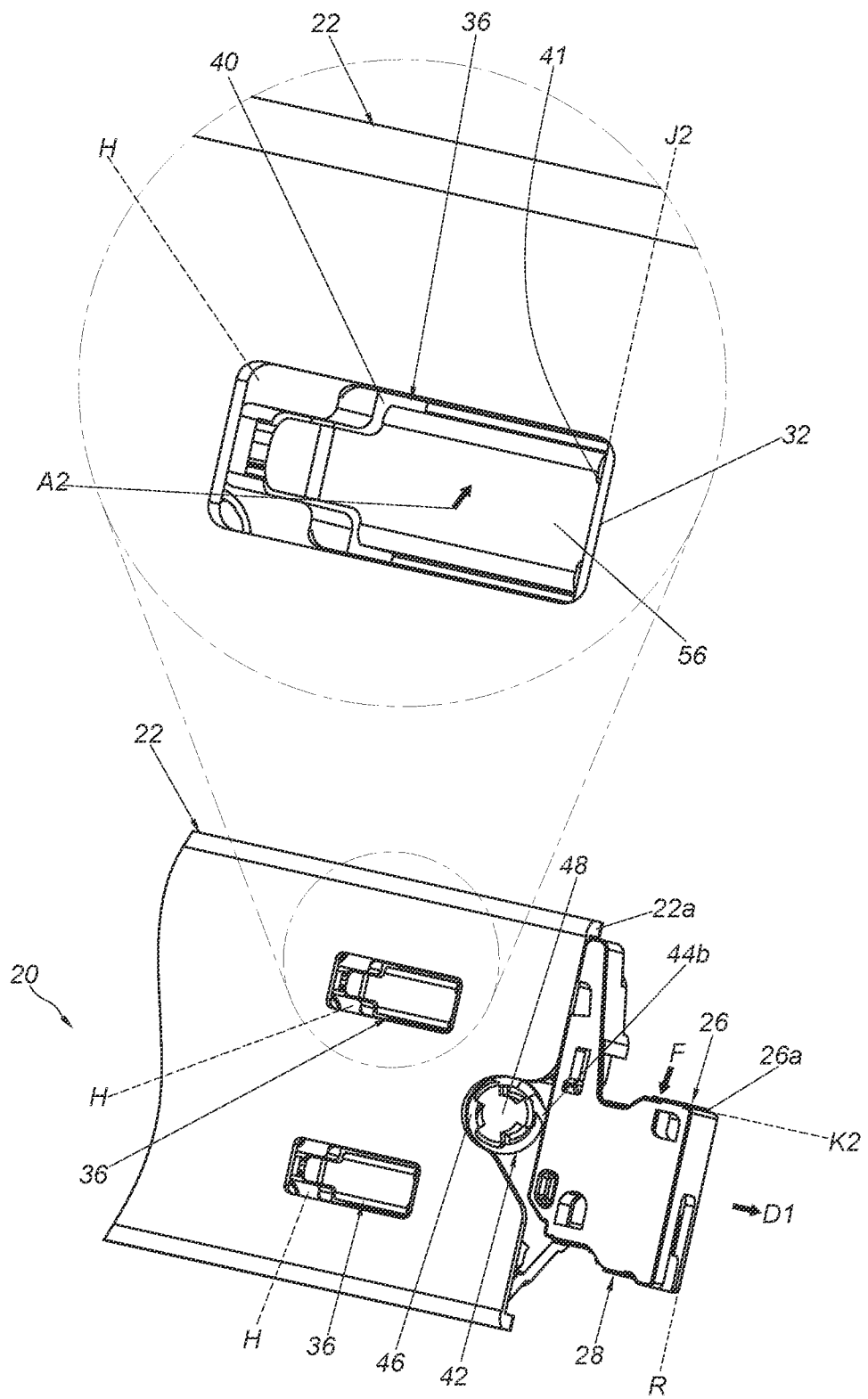
FIG. 7 is a partial view of the slide rail assembly in the second viewing angle according to an embodiment of the present invention.

As shown in FIG. 4 to FIG. 7, when a user applies a force F to the operating member 26 to move the operating member 26 from the initial position K1 (as shown in FIG. 4 and FIG. 5) to a non-initial position K2 (as shown in FIG. 6 and FIG. 7), the operating member 26 is configured to drive the driving member 38 to linearly move to further drive the locking member 36 to move in order unlock the second rail 24 relative to the first rail 22 at the predetermined position R, such that the second rail 24 is able to move away from the predetermined position R relative to the first rail 22 along a first direction D1.

Furthermore, when the force F is applied to the operating member 26 to move the operating member 26 from the initial position K1 to the non-initial position K2, the operating member 26 is configured to drive the driving member 38 to move (such as linearly move) relative to the second rail 24 from the first driving position M1 (as shown in FIG. 4) to a second driving position M2 (as shown in FIG. 6), such that the driving member 38 is configured to drive the locking member 36 to switch from the locking state J1 (as shown in FIG. 4 and FIG. 5) to an unlocking state J2 (as shown in FIG. 6 and FIG. 7). As such, the locking section 41 of the locking member 36 and the blocking feature 32 of the first rail 22 no longer block each other (as shown in FIG. 7), so as to unlock the second rail 24 relative to the first rail 22 at the predetermined position R.

Preferably, one of the operating member 26 and the driving member 38 has a first structure 58, and the other one of the operating member 26 and the driving member 38 has a second structure 60 (as shown in FIG. 4). The first structure 58 and the second structure 60 can be a combination of two inclined surfaces, a combination of an inclined surface and a curved surface, or a combination of a curved surface and an inclined surface, but the present invention is not limited thereto.

Preferably, one of the driving member 38 and the locking member 36 has a first predetermined feature 62, and the other one of the driving member 38 and the locking member 36 has a second predetermined feature 64 (as shown in FIG. 4). The first predetermined feature 62 and the second predetermined feature 64 can be a combination of two inclined surfaces, a combination of an inclined surface and a curved surface, or a combination of a curved surface and an inclined surface, but the present invention is not limited thereto.

When the force F is applied to the operating member 26 to move the operating member 26 from the initial position K1 (as shown in FIG. 4 and FIG. 5) to the non-initial position K2 (as shown in FIG. 6 and FIG. 7), the operating member 26 is configured to drive the driving member 38 to linearly move along a first predetermined direction A1 from the first driving position M1 (as shown in FIG. 4) to a second driving position M2 (as shown in FIG. 6) through contact between the first structure 58 and the second structure 60, such that the driving member 38 is configured to further drive the locking member 36 to transversely move (such as transversely displace or shift) along a second predetermined direction A2 (as shown in FIG. 4) to switch the locking member 36 from the locking state J1 (as shown in FIG. 4 and FIG. 5) to the unlocking state J2 (as shown in FIG. 6 and FIG. 7) through contact between the first predetermined feature 62 and the second predetermined feature 64. As such, the locking section 41 of the main body part 56 of the locking member 36 and the blocking feature 32 of the first rail 22 no longer block each other (as shown in FIG. 7, the locking section 41 of the locking member 36 and the blocking feature 32 of the first rail 22 are not aligned with each other) in order to unlock the second rail 24 relative to the first rail 22 at the predetermined position R, such that rail is the second 24 able to longitudinally move relative to the first rail 22 from the predetermined position R along the first direction D1.

Preferably, a linear moving direction of the driving member 38 is substantially identical to a moving direction of the second rail 24 relative to the first rail 22. For example, the linear moving direction of the driving member 38 and the moving direction of the second rail 24 are identical to the longitudinal direction.

Preferably, when the operating member 26 is located at the initial position K1 in response to the elastic force of the first elastic member 42, an operating part 26a of the operating member 26 is extended out of the space S of the connecting member 28 (as shown in FIG. 4). Accordingly, the user can know that the second rail 24 is locked at the predetermined position R. In other words, the user can know that it is required to apply the force F to the operating part 26a of the operating member 26 in order to unlock the second rail 24 at the predetermined position R.

Preferably, when the operating member 26 is located at the non-initial position K2, the operating part 26a of the operating member 26 is located inside the space S of the connecting member 28 (as shown in FIG. 6). Accordingly, the user can know that the second rail 24 is unlocked at the predetermined position R.

Preferably, a moving direction of the operating member 26 is substantially perpendicular to the linear moving direction of the driving member 38 (as shown in FIG. 4). For example, the moving direction of the operating member 26 is the vertical direction (or the height direction of the slide rail), and the linear moving direction of the driving member 38 is the longitudinal direction (or the length direction of the slide rail).

Preferably, the moving direction of the operating member 26, the moving direction of the driving member 38 and the moving direction of the locking member 36 are substantially perpendicular to each other (as shown in FIG. 4). For example, the moving direction the operating member 26 is the vertical direction (or the height direction of the slide rail), the linear moving direction of the driving member 38 is the longitudinal direction (or the length direction of the slide rail), and the moving direction of the locking member 36 is the transverse direction (or the lateral direction of the slide rail).

Preferably, one of the connecting member 28 and the driving member 38 comprises a first limiting feature 66, and the other one of the connecting member 28 and the driving member 38 comprises a second limiting feature 68 (as shown in FIG. 4). The driving member 38 is configured to move relative to the connecting member 28 within a limited range through interaction between first limiting feature 66 and the second limiting feature 68. In the present embodiment, one of the first limiting feature 66 and the second limiting feature 68 is a protruded post, and the other one of the first limiting feature 66 and the second limiting feature 68 is an elongated hole (or slot). The protruded post passes through a portion of the elongated hole (or slot).

Preferably, the connecting member 28 further comprises at least one guiding feature, such as a first guiding feature 70a and a second guiding feature 70b, and a portion of the driving member 38 is configured to be supported between the first guiding feature 70a and the second guiding feature 70b (as shown in FIG. 4), so as to improve stability of the driving member 38 when moving along a linear path (or longitudinal path). In the present embodiment, the first guiding feature 70a and the second guiding feature 70b are protrusions, but the present invention is not limited thereto.

As shown in FIG. 7 and FIG. 8, when the locking member 36 is disengaged from the blocking feature 32 of the first rail 22 (as shown in FIG. 7), the second rail 24 is able to longitudinally move away from the predetermined position R relative to the first rail 22 along the first direction D1, such that the second rail 24 is able to be located at another predetermined position E (such as an extended position as shown in FIG. 8).

Moreover, when the second rail 24 is located at the predetermined position E and when the user stops applying the force F to the operating member 26, the first elastic part 44a of the first elastic member 42 no longer abuts against the predetermined portion 49 of the first rail 22, such that the second elastic part 44b of the first elastic member 42 no longer provides the elastic force to the operating member 26, thus the operating member 26 stays at the non-initial position K2. Furthermore, when the second rail 24 is longitudinally moved from the predetermined position E along a second direction D2 opposite to the first direction D1 to return to the predetermined position R, the first elastic part 44a of the first elastic member 42 abuts against the predetermined portion 49 of the first rail 22 again, such that the second elastic part 44b of the first elastic member 42 is configured to provide the elastic force to the operating member 26 again, in order to drive the operating member 26 to return to the initial position K1 from the non-initial position K2 (as shown in FIG. 5).

Therefore, the slide rail assembly 20 according to the embodiments of the present invention has the following technical features:

1. Different from the locking member (or engaging member) of the prior art unlocking the second rail through rotation, the locking member 36 of the present invention is configured to unlock the second rail 24 at the predetermined position without rotation. As such, in contrast to the prior art, the locking member 36 of the present invention has a greater moving range, especially a greater transverse movement moving range, such that the present invention is better to apply to slide rail assemblies with different thicknesses (such as transverse thickness).
2. Since the locking member 36 is not configured to work by rotation, impact-resistant structural strength of the locking member 36 is better than that of the prior art locking the second rail relative to the first rail through rotation.
3. When the second rail 24 is located relative to the first rail 22 at the predetermined position R and when the operating member 26 is located at the initial position K1 in response to the elastic force of the first elastic member 42, the operating part 26a of the operating member 26 is extended out of the space S of the connecting member 28 (as shown in FIG. 4). Accordingly, the user can know that the second rail 24 is locked at the predetermined position R.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail;
a second rail movable relative to the first rail;
a locking member configured to lock the second rail relative to the first rail at a predetermined position;
a driving member movable relative to the second rail; and
an operating member;
wherein when a force is applied to the operating member to move the operating member from an initial position to a non-initial position, the operating member is configured to drive the driving member to linearly move without rotating relative to the second rail to further drive the locking member to move without rotating relative to the driving member and the second rail, in order to unlock the second rail relative to the first rail at the predetermined position;
wherein a linear moving direction of the driving member is substantially identical to a moving direction of the second rail relative to the first rail;

wherein a moving direction of the operating member from the initial position to the non-initial position is substantially perpendicular to the linear moving direction of the driving member.

2. The slide rail assembly of claim 1, further comprising a connecting member connected to the second rail, wherein the connecting member is formed with a space configured to accommodate the operating member.

3. The slide rail assembly of claim 2, wherein when the operating member is located at the initial position, an operating part of the operating member is extended out of the space of the connecting member.

4. The slide rail assembly of claim 3, wherein when the operating member is located at the non-initial position, the operating part of the operating member is located inside the space of the connecting member.

5. The slide rail assembly of claim 4, wherein the space of the connecting member is further configured to accommodate the driving member and the locking member.

6. The slide rail assembly of claim 3, further comprising a first elastic member, wherein when the second rail is locked relative to the first rail at the predetermined position, the operating member is configured to be held at the initial position in response to an elastic force of the first elastic member.

7. The slide rail assembly of claim 6, further comprising a second elastic member, wherein the driving member is configured to be held at a first driving position in response to an elastic force of the second elastic member; wherein when the force is applied to the operating member to move the operating member from the initial position to the non-initial position, the operating member is configured to drive the driving member to linearly move from the first driving position to a second driving position to further drive the locking member to switch from a locking state to an unlocking state, in order to unlock the second rail relative to the first rail at the predetermined position.

8. The slide rail assembly of claim 7, further comprising a third elastic member configured to provide an elastic force to the locking member.

9. A slide rail assembly, comprising:
a first rail;
a second rail longitudinally movable relative to the first rail;
a connecting member connected to the second rail;
a locking member configured to lock the second rail relative to the first rail at a retracted position;
a driving member movable relative to the second rail; and
an operating member;
wherein the connecting member is formed with a space configured to accommodate the operating member;
wherein when the operating member is moved from an initial position to a non-initial position, the operating member is configured to drive the driving member to linearly move without rotating relative to the second rail to further drive the locking member to transversely move to be switched from a locking state to an unlocking state without rotating relative to the driving member and the second rail, in order to unlock the second rail relative to the first rail at the retracted position;
wherein a linear moving direction of the driving member is substantially identical to a moving direction of the second rail relative to the first rail;
wherein a moving direction of the operating member from the initial position to the non-initial position is substantially perpendicular to the linear moving direction of the driving member.

10. The slide rail assembly of claim 9, wherein moving directions of the operating member, the driving member and the locking member are substantially perpendicular to each other.

11. The slide rail assembly of claim 9, wherein when the operating member is located at the initial position, an operating part of the operating member is extended out of the space of the connecting member.

12. The slide rail assembly of claim 11, wherein when the operating member is located at the non-initial position, the operating part of the operating member is located inside the space of the connecting member.

13. The slide rail assembly of claim 12, wherein the space of the connecting member is further configured to accommodate the driving member and the locking member.

14. The slide rail assembly of claim 11, further comprising a first elastic member, wherein the operating member is configured to be held at the initial position in response to an elastic force of the first elastic member.

15. The slide rail assembly of claim 14, further comprising a second elastic member, wherein the driving member is configured to be held at a first driving position in response to an elastic force of the second elastic member; wherein when a force is applied to the operating member to move the operating member from the initial position to the non-initial position, the operating member is configured to drive the driving member to linearly move from the first driving position to a second driving position to further drive the locking member to switch from the locking state to the unlocking state, in order to unlock the second rail relative to the first rail at the predetermined position.

16. The slide rail assembly of claim 15, further comprising a third elastic member configured to provide an elastic force to the locking member.

* * * * *